(12) United States Patent
Gerber et al.

(10) Patent No.: US 6,236,595 B1
(45) Date of Patent: May 22, 2001

(54) PROGRAMMING METHOD FOR A MEMORY CELL

(75) Inventors: Donald S. Gerber, Gilbert; Kent Hewitt; Jeffrey A. Shields, both of Chandler; David M. Davies, Phoenix, all of AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 09/617,280

(22) Filed: Jul. 17, 2000

(51) Int. Cl.[7] .................................................. G11C 16/04
(52) U.S. Cl. ...................................................... 365/185.18
(58) Field of Search ........................ 365/185.11, 185.18, 365/185.27, 185.28, 185.29

(56) References Cited

U.S. PATENT DOCUMENTS

| | | | |
|---|---|---|---|
| 5,790,455 | 8/1998 | Caywood | 365/185.27 |
| 5,818,757 | 10/1998 | So et al. | 365/185.18 |
| 5,912,842 * | 6/1999 | Chang et al. | 365/185.18 |
| 5,940,324 * | 8/1999 | Chi et al. | 365/185.29 |
| 5,986,931 | 11/1999 | Caywood | 365/185.06 |
| 6,160,739 * | 12/2000 | Wong | 365/185.29 |

\* cited by examiner

*Primary Examiner*—Trong Phan
(74) *Attorney, Agent, or Firm*—Swidler Berlin Shereff Friedman LLP (57) ABSTRACT

A method of writing and selectively erasing bits in a selected group of memory cells that significantly reduces the likelihood of disturbing data stored in other, non-selected groups of memory cells is disclosed. The method varies the bias voltages applied to bit lines in unselected cells depending upon the selected or non-selected state of the cells. This reduces the voltage differential applied to the unselected cells, reducing the possibility of inadvertently causing unwanted changes in the amount of charge stored on the respective floating gates of the unselected cells. The method of the present invention improves electrical isolation between columns of cells without increasing the distance between the cells.

13 Claims, 11 Drawing Sheets

PROGRAMMING METHOD FOR A MEMORY CELL

BACKGROUND OF THE INVENTION

The present invention relates to an improved method for erasing and writing information in an electrically alterable memory, and more particularly to a method of erasing and writing information in an electrically erasable programmable read only memory ("EEPROM").

We have discovered a unique solution to the "program disturb" problem in memory cells such as those in current P-channel EEPROM structures. Program disturb occurs when there is a write or erase to a selected group of cells in an array, and the state or content of other, non-selected cells, which is supposed to be left unchanged, is unintentionally changed. The program disturb of such other, non-selected cells may not occur as a result of one programming cycle. The unwanted change may occur incrementally and gradually over many (even millions of) programming cycles. The program disturb problem can be quite subtle and difficult to observe, but can be severely limiting for some applications of the cell.

We use the nomenclature for electrical operations performed upon an array of memory cells in a slightly different manner than typically occurs. We use here the term "write" to refer to an operation of placing electrons onto a floating gate. We use the term "erase" to refer to an operation of removing electrons from a floating gate. The term "program" as used here refers to one cycle of cell programming, which includes a write operation and an erase operation.

In addition, because of the need to densely pack memory cells, electrical isolation between adjacent columns of cells in a byte of cells being erased is a concern. Columns of cells must be spaced to maintain an acceptable level of electrical isolation.

This invention represents an improvement upon the structure and operation described in U.S. Pat. No. 5,790,455, "Low Voltage Single Supply CMOS Electrically Erasable Read-Only Memory," in U.S. Pat. No. 5,986,931, "Low Voltage Single CMOS Electrically Erasable Read-Only Memory," and in U.S. patent application Ser. No. 09/262,675, and entitled "Independently Programmable Memory Segments within a PMOS Electrically Erasable Programmable Read Only Memory Array Achieved by N-well Separation and Method Therefor," Filed Mar. 19, 1999, and assigned to the same assignee as the present application. Based on these two patents and application, the following summarizes the overall structure of an EEPROM memory array and the voltages applied to it during the write and erase operations.

The program disturb problem occurs because groups of cells share a number of common connections, including: a bit line, a word line, a source line, and an N-well. However, cells need to share these connections in order to make the memory array compact and to reduce the number of signal lines routed into it. Electrical isolation between adjacent memory cells is a concern because it is necessary to place adjacent cells as close to one another as possible to make the array compact. So, an understanding of the structure and operation of a current memory array is important to understanding how the disturb problem and electrical isolation problem become manifest and how the present invention addresses these two problems.

Figure 1:
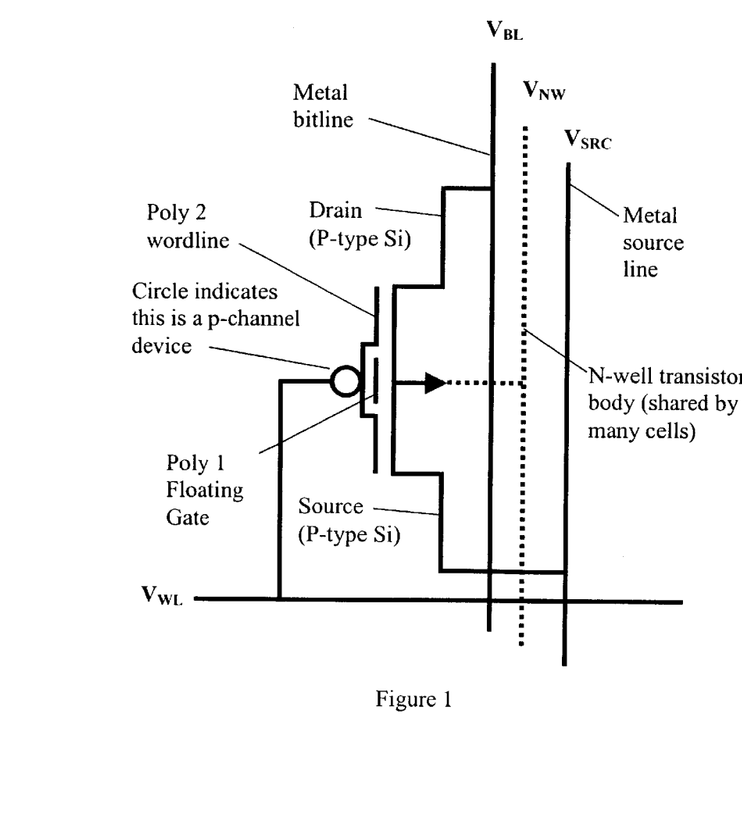
FIG. 1 is a circuit schematic diagram of a p-channel memory cell.
Figure 2:
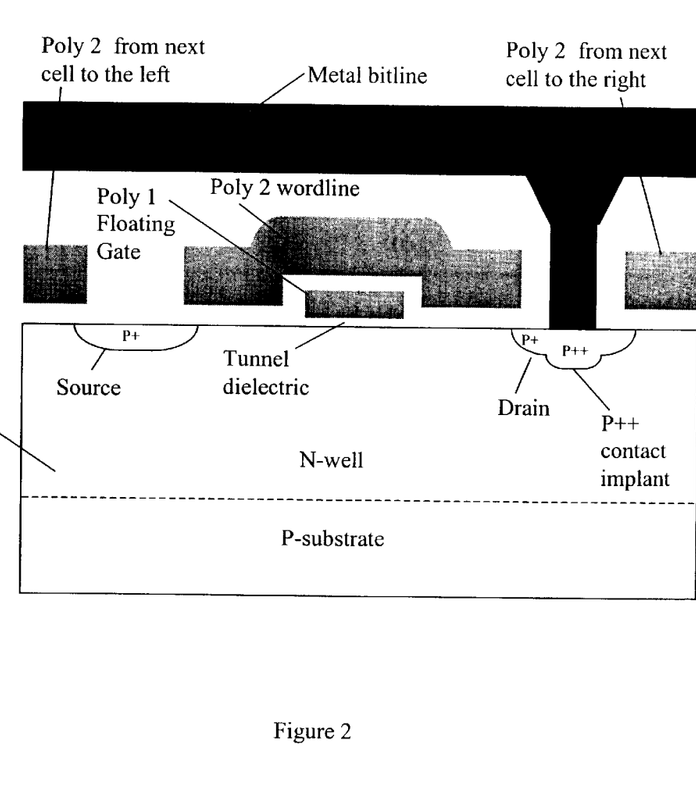
FIG. 2 is a schematic cross-section diagram of the PEEC cell, along the channel of the FIG. 1 device and in a direction parallel to the bit line.

FIG. 1 is a circuit schematic diagram of a p-channel memory cell, which will be referred to as the PEEC cell (p-channel EEPROM Cell). FIG. 2 is a schematic cross-section diagram of the PEEC cell, along the channel of the FIG. 1 device and in a direction parallel to the bit line. By comparing FIGS. 1 and 2, a correspondence can be seen between the various symbolic representations of the cell components in FIG. 1 with their physical embodiment in the cross-section of FIG. 2. For example, the source and drain of the cell are represented by simple lines on either side of the word line in FIG. 1 and these are actually p-type diffusions in an n-well shared by many memory cells as depicted in FIG. 2. In fact, each source and drain diffusion is actually shared by two adjacent cells. The "fragments" of poly 2 to the left and right of the poly 2 word line of the cell in the center of the diagram indicate this. In FIG. 1, it can be seen that there are four terminals to the cell: (1) the poly 2 word line that is shared by a row of cells, (2) the source that is connected to the metal source line, (3) the drain that is connected to the metal bit line, and (4) the N-well body that is a region of n-type silicon shared by several columns of cells. Physically, the metal bit line and source line run parallel to each other in pairs down each column of the array. Each column of cells has one bit line and one source line.

In FIG. 2, the cross-section is along and through the bit line so the metal line is visible in the cross-section. The metal source line and its contact to the source p+ region is not visible in FIG. 2 because it is parallel to the bit line and out of the plane of the paper. FIG. 1 also indicates where voltages are applied to the PEEC cell to program or read the cell information. These voltages are labeled $V_{BL}$ (the voltage on the bit line), $V_{NW}$ (the voltage on the shared N-well region), $V_{SRC}$ (the voltage on the source line), and $V_{WL}$ (the voltage on the word line).

Figure 3:
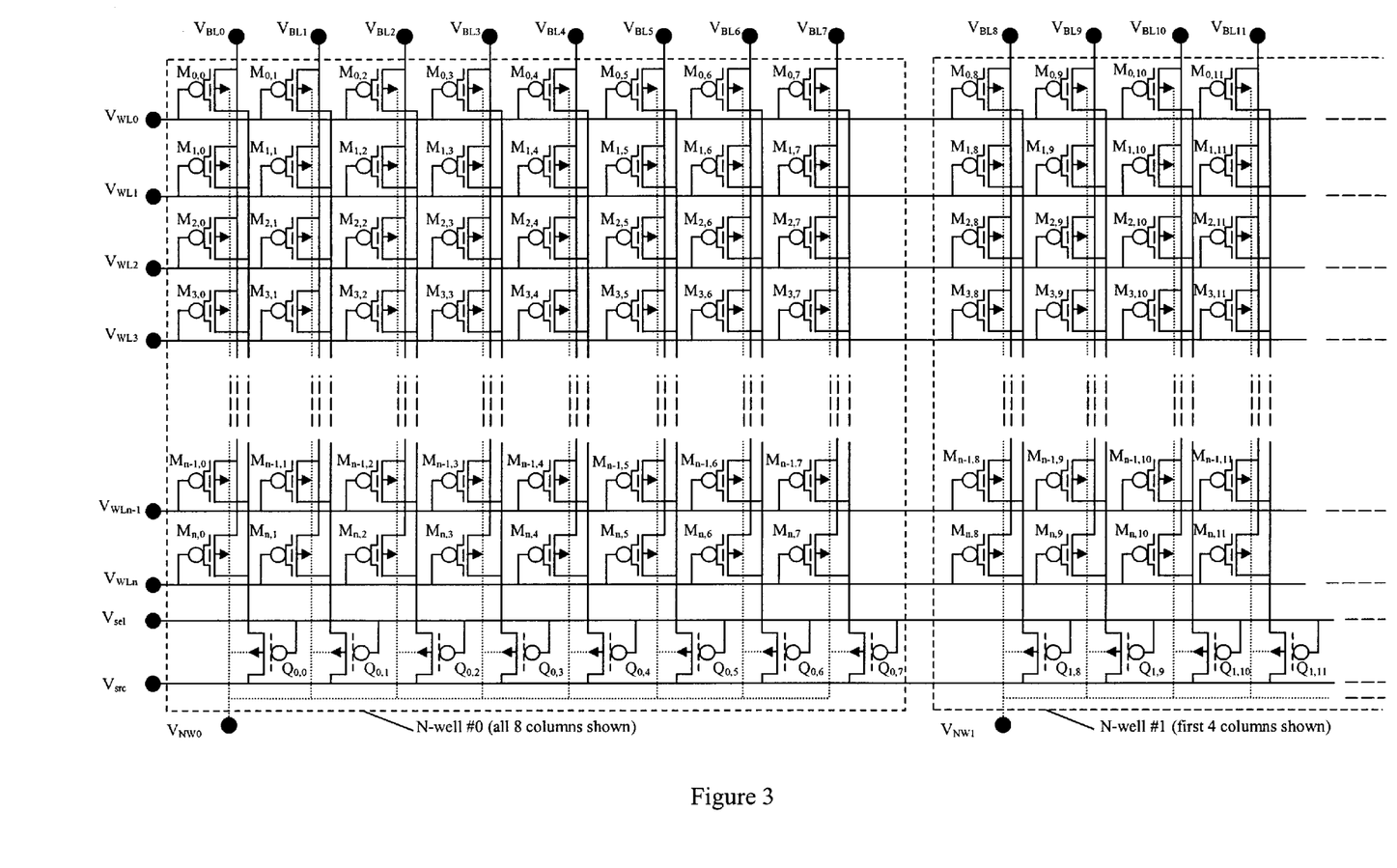
FIG. 3 is schematic diagram of a portion of a large memory array.

FIG. 3 is a schematic diagram of a portion of a large memory array. An N-well region is depicted as a dashed line box surrounding a large group of memory cells. In the figure, two N-wells, labeled N-well #0 and N-well #1, are shown. N-well #0 contains eight complete columns of cells. N-well #1 would normally also contain eight columns of cells, but only 4 columns are shown due to space limitations in the figure. Eight columns are shown as being contained in one N-well because this is the typical size of a "byte" or "word" of information. One "byte" or "word" would actually be the number of cells along the intersection of one word line with the number of columns in one N-well. Thus, one N-well contains many bytes or words, corresponding to the many word lines that cross the N-well. However, any number of columns could be contained in a single N-well (i.e. the "byte" or "word" size could be 14, 16, 32, or any number desired for the product). Also, there could be any number of N-well segments in the large array. Only two are shown because this is sufficient for the present description.

In FIG. 3, only the top four and last two rows of cells (word lines) are shown due to space limitations. In this figure, it is assumed that there are n+1 word lines, numbered from 0 through n. The number n could be only a few, or it could be hundreds or thousands. The schematic diagram for one PEEC cell that appears in FIG. 1 can be seen repeated many times in the array depicted in FIG. 3. Cells in the same column share a bit line, a source line, and the N-well (note the three parallel lines running down each column). Cells in the same row share a word line (note the single horizontal line running along each row). All cells in the array are identified individually by the notation, $M_{x,y}$, where x=the row number and y=the column number.

At the bottom of each column, the last transistor is not a PEEC cell, but a source select transistor, denoted by the notation $Q_{z,y}$, where z=the N-well number and y=the column number. The source select transistor is, as taught in the prior art patents, used at the bottom of each column to separate the column source lines during the erase operation. Otherwise the undesirable condition of having the programming high voltage signal shorted to ground could occur. The source select transistor must be turned on to read a cell and off during the erase part of a programming cycle. This is accomplished by the line running left to right which connects all of the source select transistor gates, and has the voltage label at its terminus, $V_{sel}$. When the source select transistor is turned on, it connects the voltage, $V_{src}$, which is connected to all the source select transistors to the source lines. The voltages applied to the N-wells are labeled, $V_{NW0}$ and $V_{NW1}$. The voltages applied to the word lines are labeled, $V_{WL0}, V_{WL1}, \ldots, V_{WLn}$. The voltages applied to the bit lines are labeled, $V_{BL0}, V_{BL1}$, and so on. Many commercial products, such as "byte-selectable" or "full-featured" EEPROM memories, select and program only one byte of cells at a time, leaving all other bytes in the array unaltered. This feature is assumed in the following discussion.

The above-noted U.S. patent application discloses segmentation of N-wells so as to separate the cells along each word line into individually programmable bytes. The above-noted patents specify the voltages applied to cells in the N-well containing the byte to be programmed, but do not specify the voltages to be applied to memory cells in deselected (i.e., non-selected) N-wells. The voltages applied to the deselected N-wells and their associated bit lines are specified in the above-noted U.S. patent application.

In the memory cells described above, the write operation places electrons onto the floating gate of the memory cells being written. This causes a shift in the memory transistor threshold voltage to a low negative or perhaps a positive value. The merged select transistor in the cell prevents the overall cell threshold from becoming a positive value, however. The result of the write operation is that a cell becomes conductive during a subsequent read operation.

Figure 4:
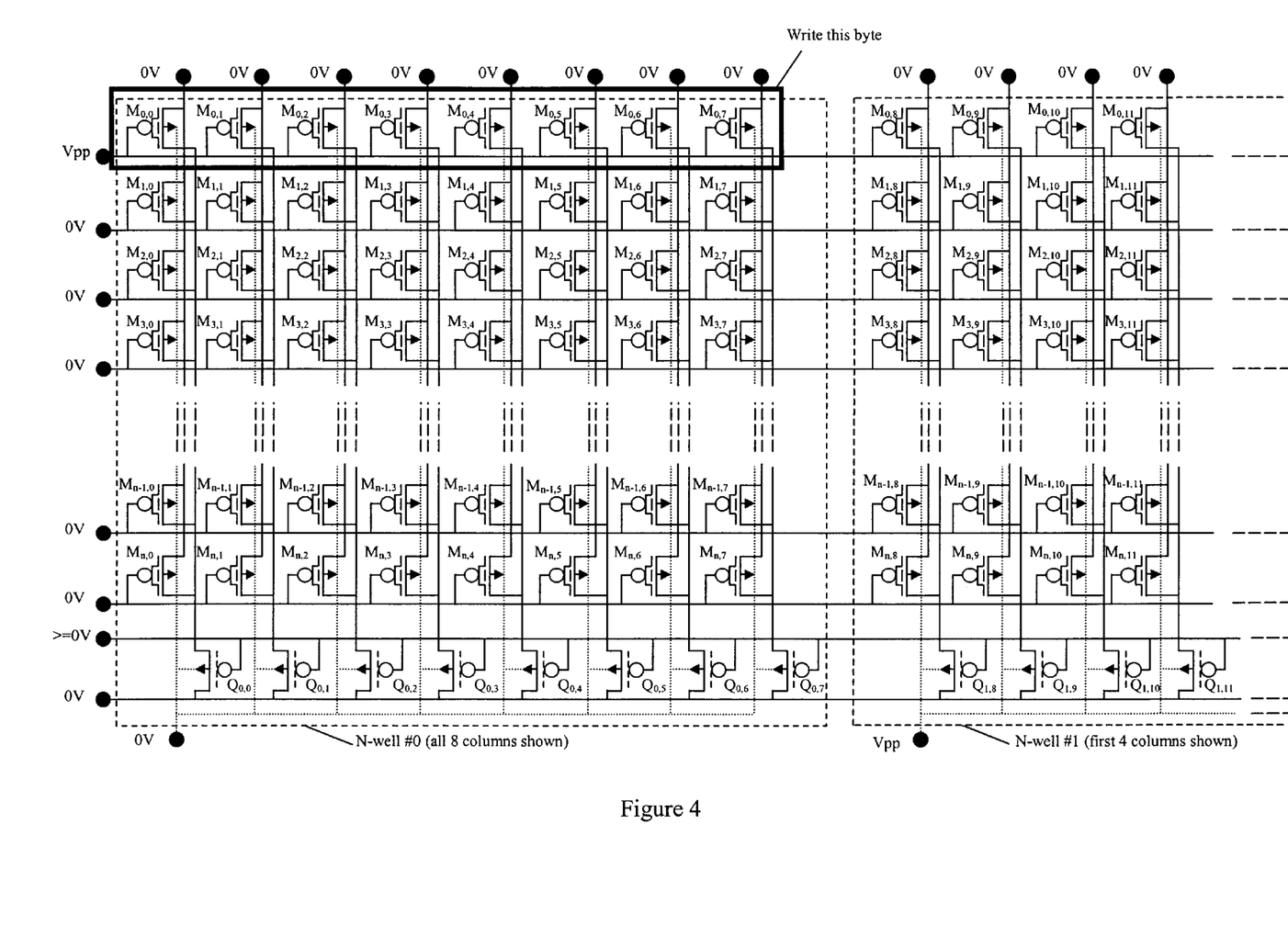
FIG. 4 is a schematic diagram corresponding to FIG. 3, but with the "write" voltages applied to a selected group of cells enclosed by the bold rectangle.

FIG. 4 is a schematic diagram corresponding to that of FIG. 3, but with the voltages that would be applied to execute a "write" operation of the target byte of cells enclosed by the bold rectangle. After executing the "write" the cells in the target byte would be placed into the conductive state during a subsequent read operation. All other bytes of cells in the array, termed "deselected" bytes, are intended to be left unaltered, the electronic charge stored on their floating gates being unchanged. The N-well of the byte to be written, N-well #0 in the example shown in the figure, is set at 0V and the N-wells of all other bytes which are deselected (unselected and not to be changed) are set at the programming voltage, Vpp. Vpp is the "high voltage" used in programming operations and typically lies in the range of 12 to 20V. The word line of the byte to be written is set at Vpp, and all unselected bytes have their word lines set at 0V. All bit lines are set to 0V. The source select line has $V_{sel}>=0V$ and the source line has $V_{src}=0V$. The source select transistors are all p-channel enhancement devices, meaning that they must have a gate-source voltage, $V_{gs}$, which is more negative than the threshold voltage, $V_{tp}$, of the device in order for their channels to be on, i.e., conduct. The voltage conditions applied in the write operation cause the source select transistors of the selected byte ($Q_{0,0}$ through $Q_{0,7}$) to be non-conductive or off. Thus all of the source lines in the selected N-well (#0) are floating. The source select transistors in the unselected N-wells may be on or off, depending upon the exact value of $V_{sel}$. In any case, it is not critical whether these source select transistors are on or off and whether the source lines are floating or connected to 0V. The results for the write operation will be the same.

Since the memory cells and source select transistors in the deselected N-wells share the signal lines running horizontally in the array (e.g. the word lines) with the cells in the selected N-well (in FIG. 4, N-well #0), they must have their voltages set so as not to cause a change in the stored charge on the deselected or unselected memory cells. The word line voltage of the byte that is being written is at Vpp with the selected N-well at 0V in order to cause electrons to tunnel through the thin dielectric layer between the N-well and floating gate. This requires all deselected N-wells to have Vpp applied to them to avoid also writing the cells along the same word line (e.g. cells $M_{0,8}$ through $M_{0,11}$ in FIG. 4). The deselected word lines have 0V applied to them over the selected N-well to avoid writing the unselected cells. For cells in the deselected N-wells that receive Vpp, these same word lines have 0V. Thus the bit lines of the cells in the deselected N-wells must have 0V applied to them to avoid changing the charge on their floating gates. An example of one such cell is $M_{1,8}$. Its N-well is at Vpp and its word line is at 0V, causing the cell channel to be in inversion. With the bit line of this cell set to 0V, however, the inversion layer of charge present in the cell channel under the floating gate is also set to 0V since it is connected electrically to the bit line via the drain p-type diffused region. Thus the potential difference applied between the word line and inversion layer under the floating gate is 0V, and no inadvertent programming should occur.

Figure 5:
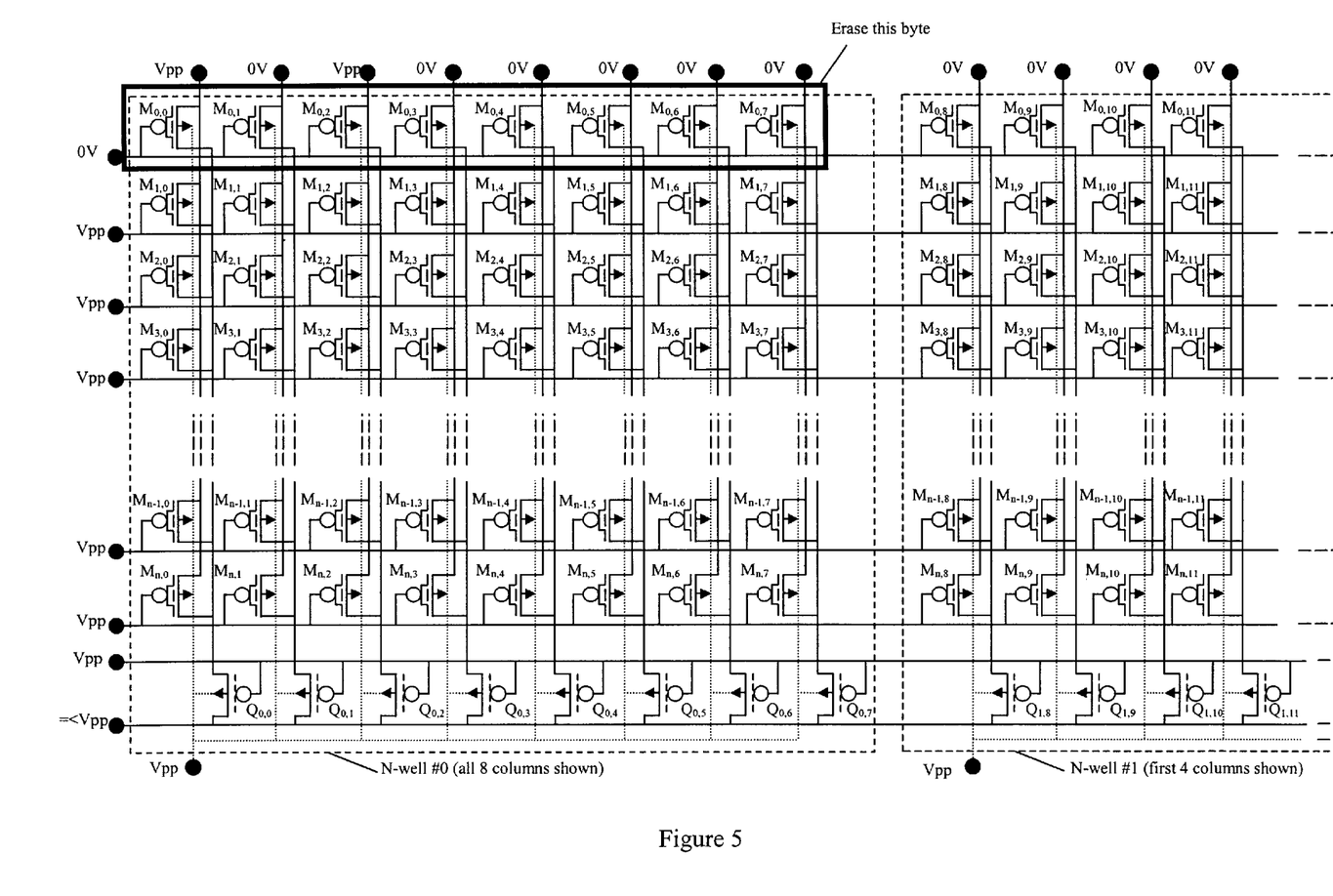
FIG. 5 is a schematic diagram corresponding to FIG. 3, but with the "erase" voltages.

The erase operation removes electrons from the floating gates of the cells being erased, giving them a high negative threshold voltage and causing them to be in the non-conductive state when read. FIG. 5 is a schematic diagram corresponding to FIG. 3, but with voltages applied for an erase operation. As with FIG. 4, a target byte is enclosed in a bold line rectangle. Unlike the write operation in which all cells in the target byte are set to the same predetermined state, the erase operation only erases cells in the target byte that are desired to be in the non-conductive state. The erase operation leaves the other cells in the target byte in the conductive state. This allows impressing a "bit pattern" into the byte of cells, with some in the binary "0" state and some in the binary "1" state. As noted above, a programming cycle includes writing all of the cells to a predetermined state (e.g., a conductive state) and then selectively erasing some of the cells to a non-conductive state, leaving the others unchanged. Only cells with their bit lines set to Vpp in the erase operation will be erased, those with bit lines set to 0V will be left in the written state. In the example shown in FIG. 5, only cells $M_{0,0}$ and $M_{0,2}$ will be erased in the target byte. The target byte has its N-well set at Vpp and its word line set at 0V. Deselected word lines are set at Vpp and $V_{sel}$=Vpp, so that all source select transistors are off and all source lines are disconnected from $V_{src}$. Comparing FIGS. 4 and 5, it can be seen that the deselected N-wells (N-well #1) and their associated bit lines have the same voltages applied in the erase operation as in the write operation. The main difference these deselected cells see is a reversal of the word line voltages with the word line of the target byte set to 0V instead of Vpp and the deselected word lines set to Vpp instead of 0V. The same approach to preventing unwanted erasing of the cells in these deselected N-wells as for a write operation applies to the erase operation as well. It should be noted that all of the above is discussed in U.S. Pat. No. 5,986,931 (in particular, FIG. 21, table 8 and text column 22 of the patent). That Patent does not disclose the voltages applied to the deselected N-wells (for example, N-well #1 in FIG. 4) and the bit lines contained within them.

The read operation involves applying only low voltages to the array to detect which memory cells are conductive and which are non-conductive. The details of reading the cell are well known and not important for an understanding of the present invention.

SUMMARY OF THE INVENTION

It is an object of the present invention to provide a method of operating a memory cell to reduce the instance of the program disturb problem.

It is another object of the present invention to provide a method of operating a memory cell to reduce the instance of the program disturb problem that does not depend upon changing the size of a memory cell.

It is a further object of the present invention to provide a method of operating a memory cell that permits high density packing of memory cells without sacrificing electrical isolation between columns of cells.

It is still another object of the present invention to provide a method of operating a memory cell that provides sufficient electrical isolation between columns of memory cells without increasing the distance between columns of cells.

It is still a further object of the present invention to provide a method of operating a memory cell that allows greater flexibility in the fabrication process without sacrificing either cell density or electrical isolation between columns of memory cells.

To achieve the above and other objects the present invention provides a method of programming memory cells, where, for example, a first group of cells are formed in a first semiconductor region and are operatively coupled to a word line. Cells of a second group are formed in a second semiconductor region and are operatively coupled to the word line. According to an aspect of the present invention, the method comprises applying a first voltage to the word line and applying a second voltage to the first semiconductor region. The bit lines of the first group of cells receive selected voltages and the second semiconductor region receives a fourth voltage, and a fifth voltage is applied to the bit lines of the second group of cells. During a first time period of operating the memory, the first and fourth voltages are substantially the same, and the second and the selected voltages are substantially the same, and the fifth voltage is selected from the range of the first voltage to the second voltage. During a second time period of operating the memory, the second and fourth voltages are substantially the same and different from the first voltage, the fifth voltage is selected in the range of the first voltage to the second voltage, and the selected voltages being selected from the second and fifth voltages.

To achieve the above and other objects the present invention further provides a method of erasing memory cells formed in a semiconductor region, a first group of the cells operatively coupled to a word line, a second group of the cells operatively coupled to the word line. The method comprises applying a first voltage to the word line; applying a second voltage to the semiconductor region; applying selected voltages to the bit lines of the first group of cells; and applying a fourth voltage to the bit lines of the second group of cells. The first and second voltages are different, the fourth voltage is selected from the range of the first voltage to the second voltage, and the selected voltages being selected from the second and fourth voltages.

The present invention can be applied to many types of memories, and in particular those memories that store information by storing charges in a cell transistor. As an example of an embodiment of the present invention, the following discusses the present invention in view of an illustrative structure of an EEPROM.

DETAILED DESCRIPTION OF THE PREFERRED EMBODIMENTS

Program disturb is the unintentional alteration of charge on the floating gate of a cell which is not in the target byte being programmed during the programming cycle. Program disturb can occur during the write or erase operations and may occur incrementally, requiring many programming cycles before the threshold voltage of the cell is shifted enough to read a different binary state than originally programmed. While it is not obvious even to those experienced in the field of the invention, program disturb can take place with the write and erase conditions applied in FIGS. 4 and 5, respectively. This is true even though different groups of cells are affected in the write operation than in the erase operation.

Referring to FIG. 4 showing the voltages applied for a write operation, the voltages applied to the cells in the deselected N-well along the same word line as the byte being written may be examined. These are the cells designated $M_{0,8}$, $M_{0,9}$, $M_{0,10}$, and $M_{0,11}$ in the figure. These cells have their N-well and word line both set to Vpp and their bit lines set to 0V. If $V_{sel}$=0V, then the source select transistors are all on in that N-well and the source lines of these cells are connected to $V_{src}$=0V. Even if $V_{sel}$=Vpp and the source select transistors are off, the sources of $M_{0,8}$, $M_{0,9}$, $M_{0,10}$, and $M_{0,11}$ will still be connected to the 0V applied to the bit lines because the other cells along the column with their word lines at 0V and the N-well at Vpp will be conductive and connect the common source line to the bit line voltage.

Figure 6:
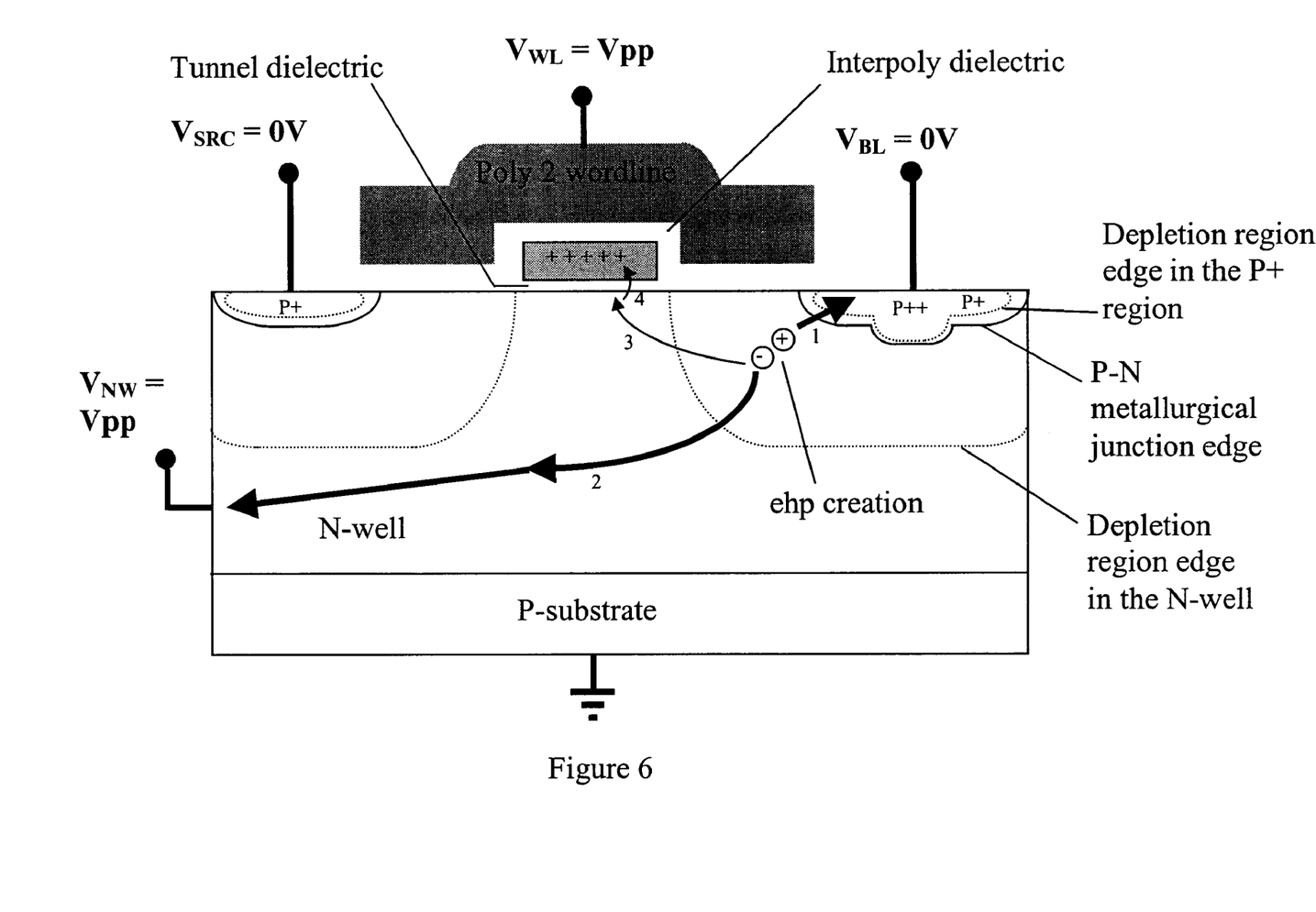
FIG. 6 is a cross-sectional view of one of the cells, $M_{0,8}$, $M_{0,9}$, $M_{0,10}$, or $M_{0,11}$ in FIG. 4.

FIG. 6 is a cross-sectional view of one of the cells, $M_{0,8}$, $M_{0,9}$, $M_{0,10}$, or $M_{0,11}$ in FIG. 4, with the set of applied voltages listed above. In the figure, the metallurgical junction boundary (solid line) is shown as are the limits of the depletion region (dashed lines) which extends into both the P+ side of the junction and the N-well side of the junction. As one of ordinary skill in the art of semiconductor device physics can appreciate, the depletion region extends much further into the N-well side of the p-n junction, than the P+ side due to the typically much lower doping concentration in the N-well versus the P+ regions that form the drain and source. It is assumed in the figure that the cell under examination is in the erased charge state with a net positive charge on the floating gate in this example. This is symbolized with the row of "+" signs on the floating gate. The actual potential of the floating gate is a function of the net charge on it and the potentials of the N-well and word line which couple their potentials to it capacitively. If there were zero net charge on the floating gate and both the N-well and word line are at Vpp as shown in the figure, then the floating gate potential would also be approximately at Vpp. Since there is assumed a net positive charge on the floating gate, however, the floating gate potential is at some value greater than Vpp. For an erased cell the potential due to charge on the floating gate would typically lie in the range of +2V to +6V. Thus, the actual potential of the floating gate with the applied voltages shown in the figure would lie in the range of Vpp+2V to Vpp+6V. Even though the same voltage is placed on both the N-well below the floating gate and the word line surrounding it, there is an electric field across the tunnel dielectric between the floating gate and N-well. The direction of the electric field is such as to cause electrons to be attracted to the N-well surface under the floating gate. However, the field is not large enough to cause the normal Fowler-Nordheim tunneling of electrons across the tunnel dielectric and onto the floating gate as is used in the write operation. This lack of tunneling is true as long as the conduction electrons in the N-well have energies near the conduction energy band in the N-well. If a portion of the conduction band electron population is given sufficient energy above the conduction band energy level, though, some electrons may have enough energy to surmount the energy barrier between the conduction bands of the silicon N-well and the tunnel dielectric. If the tunnel dielectric were SiO2, this barrier height would be approximately 3.2 eV. Having surmounted the energy barrier, these energetic or "hot" electrons are then able to make their way through the tunnel dielectric and onto the floating gate. They would then begin to compensate the positive charge initially present on the floating gate. If enough electrons surmount the energy barrier and collect on the floating gate over time, then the charge state of the memory cell will change, during a subsequent read, from the non-conductive erased state to the conductive written state, resulting in a loss or corruption of the stored data.

As noted above, if electrons with energy sufficiently greater than the silicon conduction band energy were present in the N-well near the floating gate, they could surmount the tunnel dielectric barrier and change the charge on the floating gate. Attention is now focused on how these energetic electrons could be created in the N-well. Those with ordinary skill in the art of semiconductor device physics know that there are a number of mechanisms by which electron-hole pairs (ehp) can be created in a reverse biased P-N junction depletion region. The most important mechanisms are: (1) thermal generation, (2) impact ionization, (3) band-to-band tunneling, and (4) optical excitation. It is reasonable to eliminate optical excitation as an important mechanism for the present discussion because in the EEPROM products of interest in this invention, light is typically shielded out by the packaging materials used to surround the chip.

FIG. 6 schematically illustrates the creation of electron-hole pairs in the drain junction depletion region with the electrons and holes represented by a circle with a "−" sign and "+" sign, respectively. Electron-hole pairs may be created by any of the three mechanisms described above. Once created, the holes are swept toward the p-side of the junction and the electrons toward the n-side by the electric field in the depletion region. The holes enter the neutral region of the P+ drain junction and flow out the drain contact (arrow labeled 1). The vast majority of electrons enter the neutral region of the N-well and flow out the N-well contact (arrow labeled 2). Some of the electrons which enter the neutral N-well region are attracted toward the surface by the positively charged floating gate or have their momentum directed toward the surface by elastic collisions with lattice sites or Coulombic scattering events with ionized dopant atoms (arrow labeled 3). The population of electrons that arrive at the silicon-tunnel dielectric interface do not all have the same energy. As electrons generated in the depletion region gain energy due to acceleration by the electric field, they undergo scattering events that cause them to lose some of the energy gained. Statistically, some electrons will lose more energy than others. Thus, it can be appreciated that there is a distribution of energies among the electrons entering the neutral N-well from the depletion region with many having insufficient energy to surmount the barrier at the interface. There will be some, however, that do have sufficient energy to surmount the barrier and add their charge to the floating gate (arrow labeled 4).

Referring to FIGS. 4, 5, 9 and 10, it will be clearly understood by those skilled in the art that the program disturb problem can also occur in a case in which all memory cells are placed in a single semiconductor region, such as a single N-well region. As depicted in FIGS. 4 and 5, there would be only one semiconductor region, such as N-well #0 containing all cells of the memory. As an example, cells $M_{0,8}$ . . . $M_{0,11}$ would all be in the same semiconductor region, such as a common N-well. In such a case, however, program disturb only occurs during an erase operation, not during a write operation. This is because during a write operation the only word line set to Vpp is that for the row being written. In the erase operation, the word lines of all deselected (i.e., non-selected) rows are set to Vpp. Without employing the present invention, program disturb can occur in the cells of these rows. Applying the present invention to these rows minimizes program disturb from occurring during an erase operation.

Figure 7:
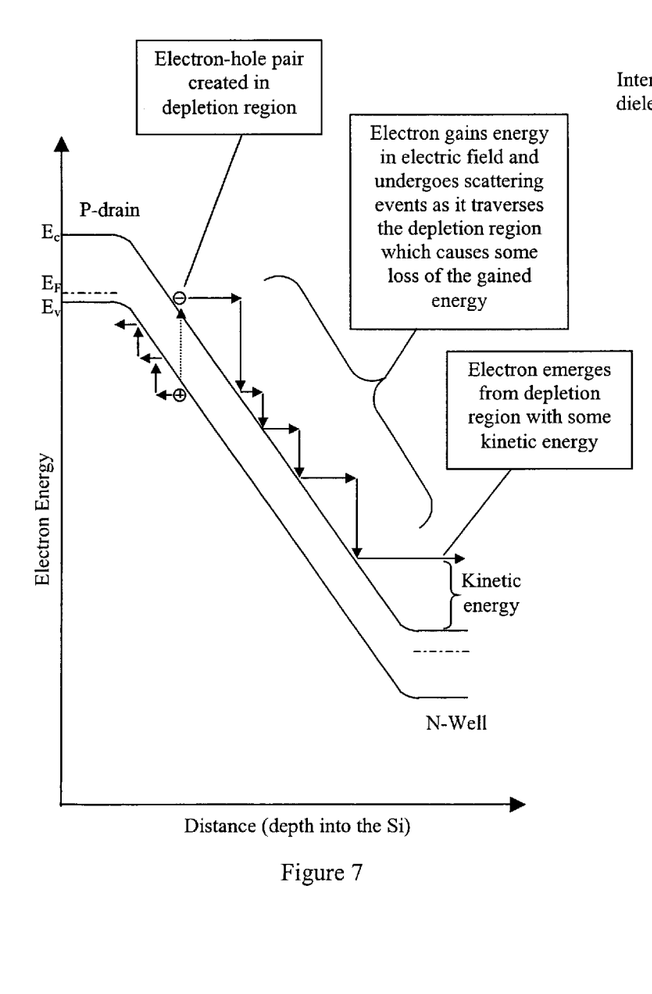
FIG. 7 illustrates the sequence of events leading up to an energetic electron arriving at the silicon-tunnel dielectric interface.
Figure 8:
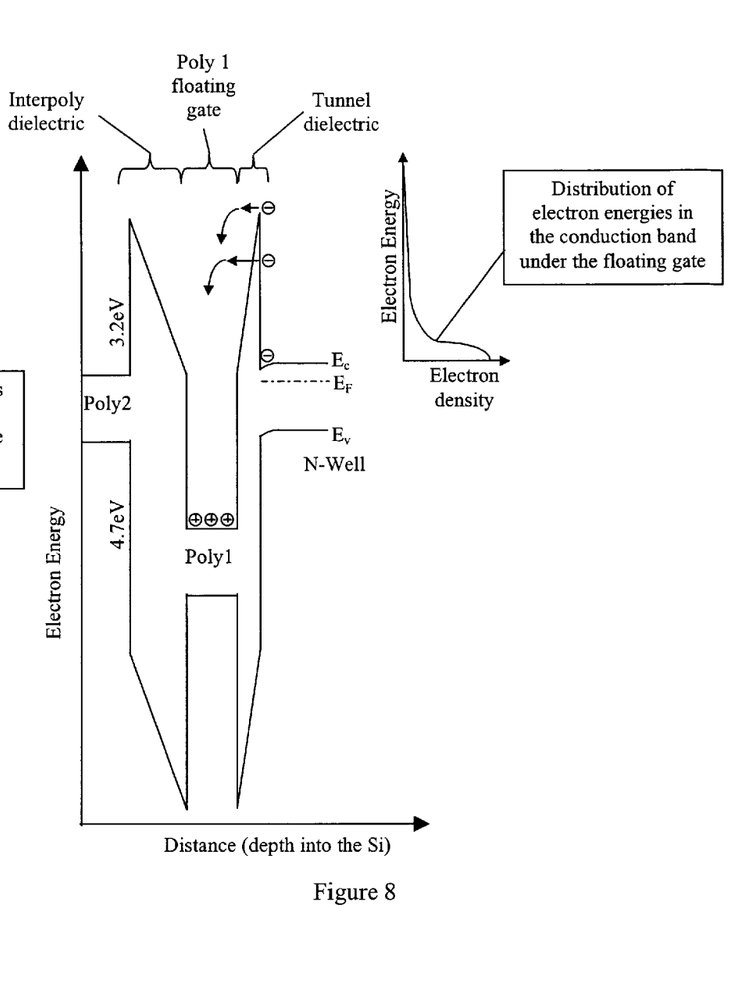
FIG. 8 is a band diagram schematically illustrating the concept of a population of electrons arriving at the silicon-tunnel dielectric interface with a distribution of energies.

FIGS. 7 and 8 are energy band diagrams that illustrate the process of electrons gaining energy in the depletion region and surmounting the energy barrier. FIG. 7 illustrates the sequence of events leading up to an energetic electron arriving at the silicon-tunnel dielectric interface. First, an ehp is created in the depletion region. The electron is swept to the right by the electric field present in the depletion region and gains energy. As it traverses the depletion region, it undergoes scattering events and gives up some of its energy. It eventually reaches the edge of the depletion region and enters the neutral N-well with still some energy above the conduction band. FIG. 8 is a band diagram schematically illustrating the concept of a population of electrons arriving at the silicon-tunnel dielectric interface with a distribution of energies. The small inset graph of electron density versus energy placed level with the N-well conduction band illustrates the concept that there is a small "tail" in the distribution with large enough energy to surmount the barrier. Since there is a positive charge on the floating gate in the erased cell, it represents a potential well on the diagram and the positive charge also lowers the barrier of the tunnel dielectric at the top which aids electrons by a small amount. Two electrons are shown surmounting the barrier, one that has enough energy to completely go over the top and one near the top with enough energy to tunnel through the barrier aided by the electric field from the positive charge.

Given the above mechanisms for generating a population of energetic electrons near the floating gate, the present invention seeks to do two things: (1) reduce the number of such electrons generated per second, and (2) reduce the percentage of the population generated that have sufficient energy to surmount the tunnel dielectric barrier separating the floating gate from the N-well. This is accomplished by applying a voltage to the bit lines during the write and erase operations that will reduce the reverse bias across the P-N junctions of the sources and drains.

Figure 9:
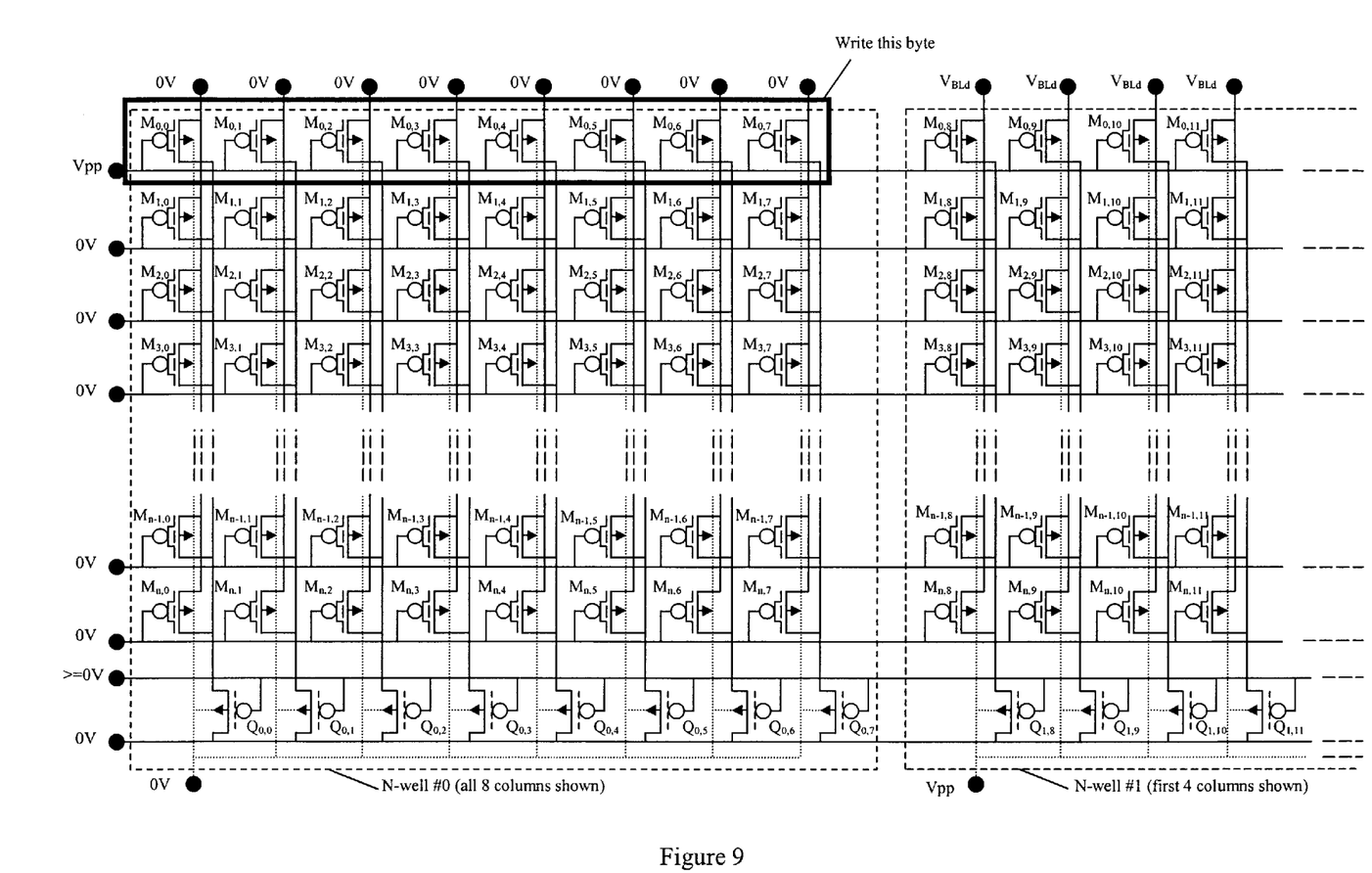
FIG. 9 is a schematic diagram corresponding to FIG. 3, but with the application of a bit line voltage, $V_{BLd}$, during a write operation.
Figure 10:
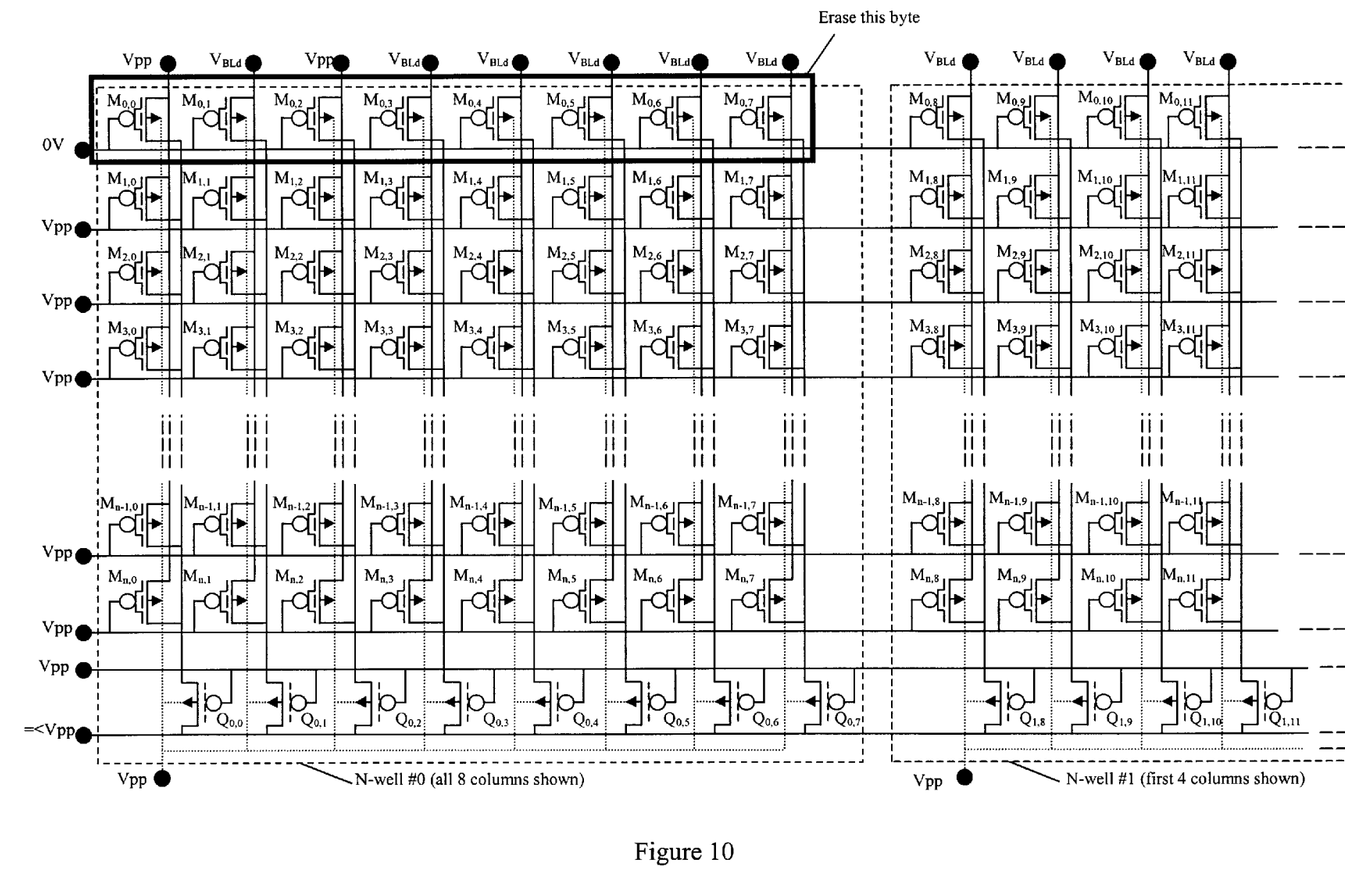
FIG. 10 is a schematic diagram corresponding to FIG. 3, but with the application of a bit line voltage, $V_{BLd}$, during an erase operation.

FIGS. 9 and 10 are schematic diagrams corresponding to FIG. 3, but with the application of a bit line voltage, $V_{BLd}$, during the write and erase operations, respectively. $V_{BLd}$ is a voltage that is positive (>0) with respect to ground (0V). In FIG. 9, $V_{BLd}$ is applied to the bit lines of all cells in all deselected N-wells (example, N-well #1). In FIG. 10, $V_{BLd}$ is applied to the bit lines of all cells in all deselected N-wells, and also to the bit lines in the selected N-well which are not set to Vpp. As described above, a byte is first written, placing all cells in a predetermined state, and then cells are selectively erased to impress the desired pattern of 1's and 0's into the cells of the target byte. To serve as an illustration, FIG. 10 shows just one possible combination of bit lines in the target byte with Vpp and $V_{BLd}$ applied.

The result of applying the bit line voltage is that all cells that had the set of applied voltages which would cause program disturb, as shown in FIG. 6, now have $V_{BL}=V_{BLd}$ instead of $V_{BL}=0V$. This means that the P-N junctions forming the sources and drains of the cell now have a reverse bias of Vpp–$V_{BLd}$ instead of Vpp–0V. This reduction in reverse bias has several beneficial effects. First, the width of the depletion region is reduced so that the total volume of silicon enclosed by it is reduced. This reduces thermal generation of electrons. The rate of thermal generation, G, may be approximated by the equation $G=2n_i/\tau_g$, where $n_i$ is the intrinsic carrier concentration in silicon and $\tau_g$ is the effective carrier generation lifetime. The intrinsic concentration, $n_i$, is a basic material property of silicon and it is highly temperature dependent, increasing rapidly with increasing temperature. The units of G are therefore ehp generated per $cm^3$ per second. To obtain an approximation of the total number of ehp generated in the depletion region per second, G is multiplied by the volume of the depletion region.

Second, the electric field in the depletion region is reduced and this reduces the number of ionizing collisions occurring per second in it, which in turn reduces the total number of energetic electrons generated per second due to impact ionization. Third, the overall energy distribution of electrons emerging from the edge of the depletion region into the N-well is reduced to lower values of energy. With lower electric field in the depletion region, it is statistically more difficult to generate as many electrons with the high energy needed to surmount the tunnel dielectric barrier. As a consequence of these beneficial effects, many more write/erase cycles are required to cause program disturb than would otherwise have been the case with 0V applied to the bit lines of these cells as in the prior art. Thus, the susceptibility of memory cells to this type of program disturb phenomenon has been substantially lowered.

It will be clear to those skilled in the art of semiconductor device physics that the larger the value of $V_{BLd}$, the greater the improvement in program disturb will be. However, $V_{BLd}$ will have an upper limit above which other disturb problems occur. An example of this can be seen in FIG. 10 for the cell labeled $M_{0,8}$. This cell is one that is not to be erased. It has the N-well at Vpp and its word line at 0V, so the N-well surface is inverted and a channel is formed underneath the floating gate. This channel is connected to the bit line voltage via the P+ drain and, thus, there is a potential difference between the word line and the channel, now connected to $V_{BLd}$. The floating gate is coupled closely to the word line for most practical values of coupling ratio (typically in the range of 0.6 to 0.8), and so is close to ground. The positive voltage on the channel causes an electric field across the tunnel dielectric. This electric field depends not only upon the coupling ratio and $V_{BLd}$, but also on the charge stored on the floating gate, Qfg. The largest electric field occurs for a cell that is in the written state with negative charge stored on the floating gate. If the field is large enough, electrons will tunnel off of the floating gate to the positive potential of the channel by Fowler-Nordheim tunneling. Even for electric fields well below the 10 MV/cm required for significant Fowler-Nordheim tunneling, charge loss from the floating gate can still occur across a tunnel dielectric that has been repeatedly stressed by write/erase operations. This leakage phenomenon at low electric fields in stressed dielectrics is termed "stress-induced leakage current" (SILC) and is well-known to those skilled in the art. This effect places an upper limit upon $V_{BLd}$ and this limit will be highly dependent upon the nature of the tunnel dielectric (thickness, growth conditions) and the coupling ratio. A practical upper limit to $V_{BLd}$ is about 8V, but may be as low as 2V in some technologies.

In addition to improving the susceptibility to program disturb, applying a bit line bias according to the present invention also improves the isolation between adjacent columns of cells in a byte that is being erased (see FIGS. 5 and 10). In FIG. 5, it can be seen that in N-well #0, adjacent bit lines can be at different potentials. For example, the first bit line from the left has Vpp applied to it and the second bit line from the left has 0V applied to it with the N-well at Vpp and the polysilicon word line at 0V. This is also the worst-case condition for turning on a parasitic field transistor between the cell columns.

Figure 11:
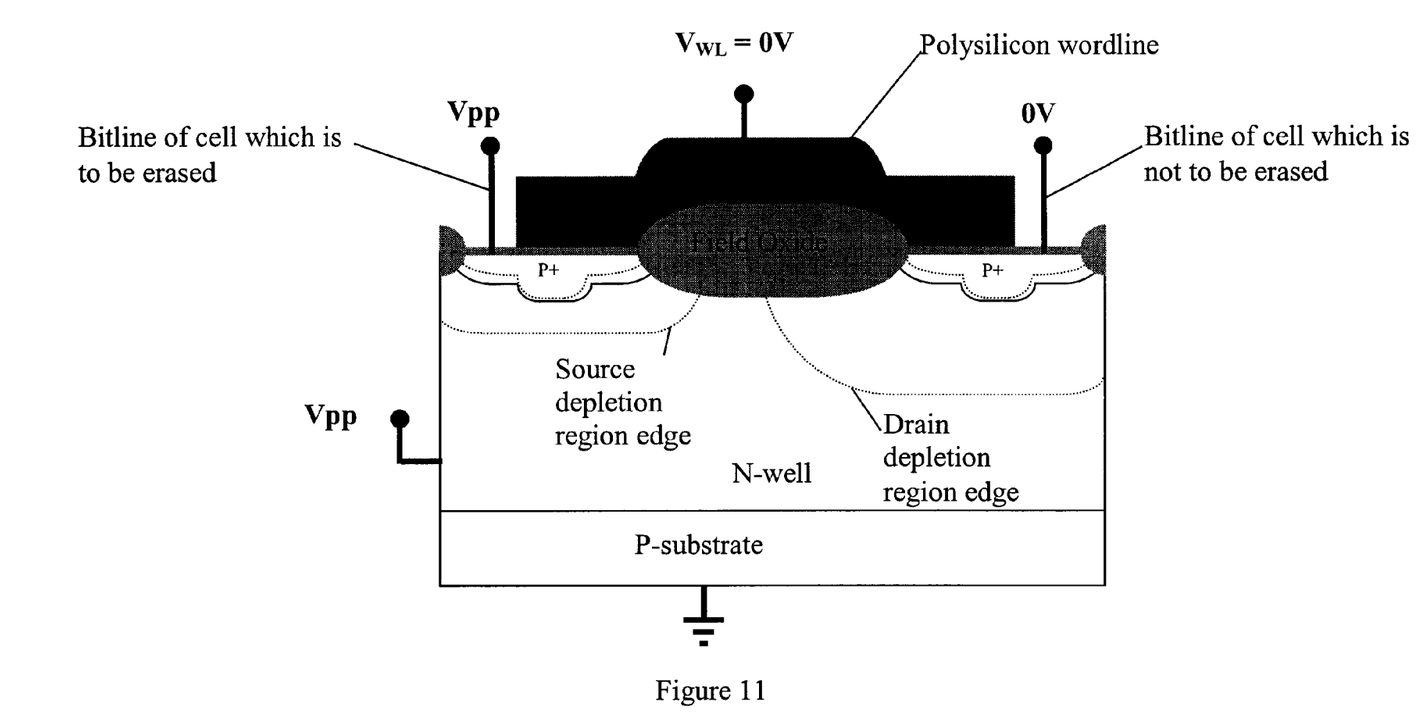
FIG. 11 is a schematic cross-section diagram of the parasitic field transistor formed between the cell columns.

FIG. 11 is a schematic cross-section diagram of the parasitic field transistor formed between the cell columns. The cross-section is taken perpendicular to the columns and along the word line. The "gate oxide" of this parasitic field transistor is the thick field oxide between the columns and its gate is the polysilicon word line. The source and drain of the parasitic field transistor are the P+ drains of the cells in the adjacent columns. The fabrication process for the memory should be designed so as to ensure that the threshold voltage of this parasitic field transistor is greater than Vpp. In addition to this, however, the columns of cells must be spaced far enough apart to also ensure that punch through from drain to source does not occur. Punch through occurs when the depletion regions of the adjacent columns are so close as to touch and allow the drain potential to lower the barrier to current injection from the source. This is the well-known drain-induced barrier lowering (DIBL) effect in short-channel MOSFETs. This effect limits the column to column spacing to some minimum value, below which large leakage currents between columns would occur.

Figure 12:
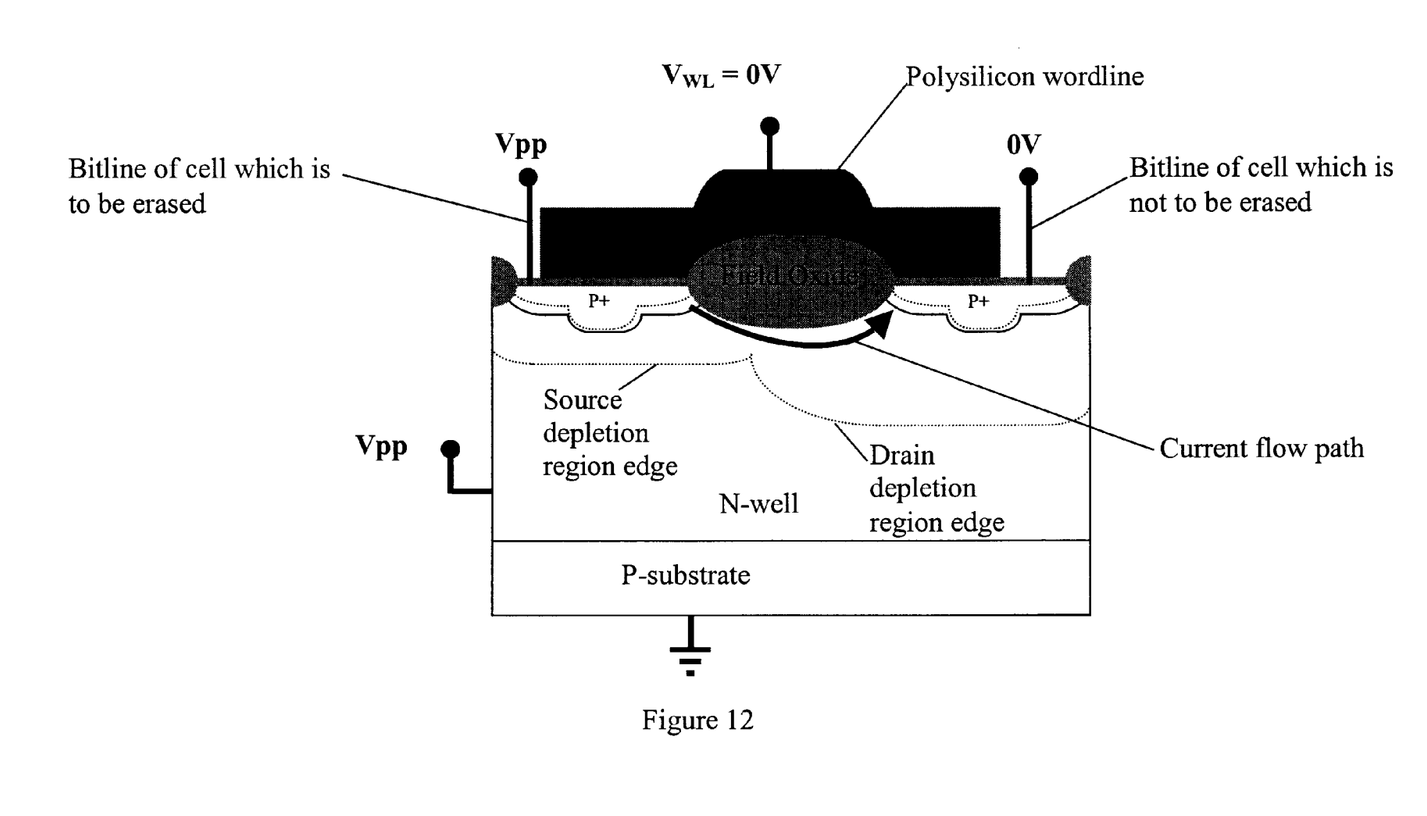
FIG. 12 illustrates the case in which the spacing between columns is so narrow that the drain depletion region has merged with the source depletion region.

FIG. 11 illustrates the case in which the columns are placed far enough apart so that the drain depletion region does not touch the source depletion region. FIG. 12 illustrates the case in which the spacing between columns is so narrow that the drain depletion region has merged with the source depletion region. The bold arrow indicates a current flow path for leakage current between the source and drain. In FIG. 12, Vpp is applied to the first bit line (the source of the field transistor) and 0V is applied to the second bit line (the drain of the field transistor). This makes the drain-source voltage, Vds=0V−Vpp=−Vpp.

Figure 13:
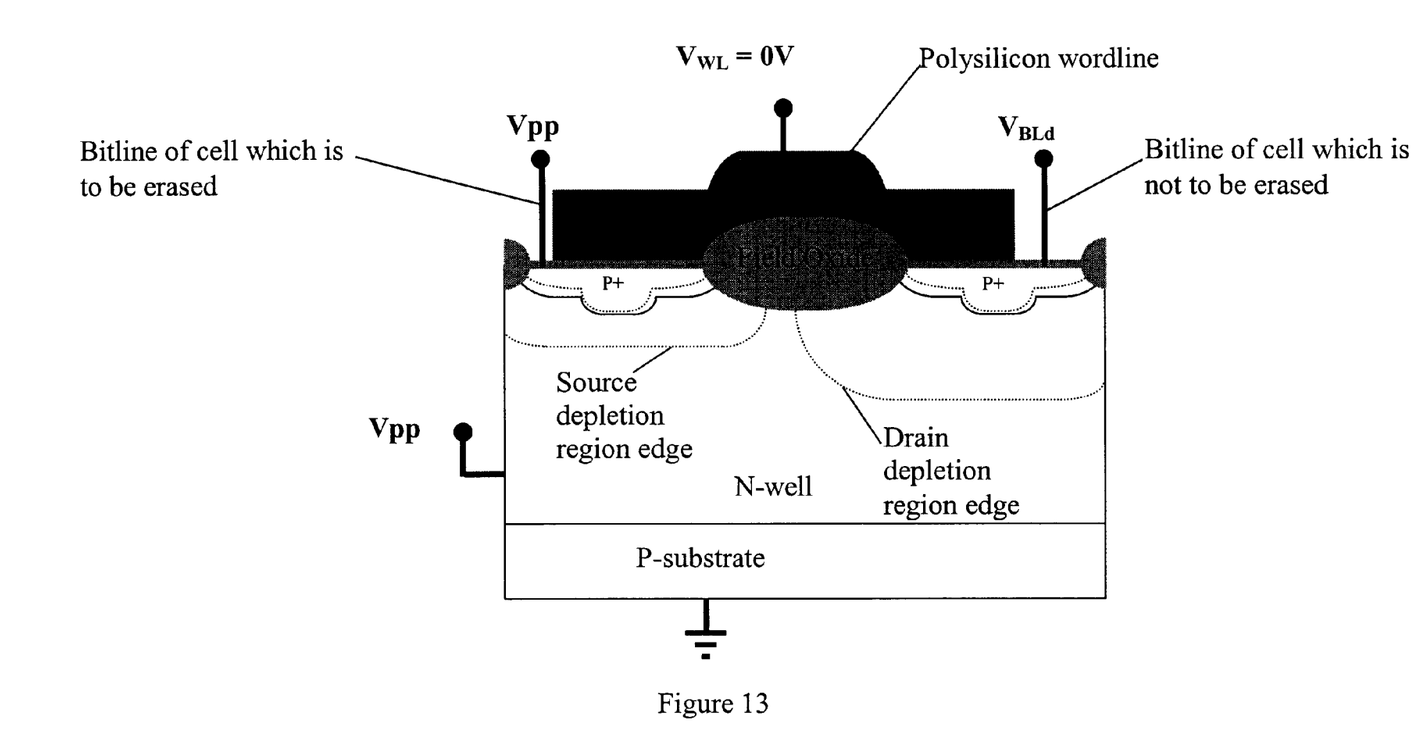
FIG. 13 illustrates the case with the same narrow column spacing as in FIG. 12, but with improved drain depletion region in accordance with an embodiment of the invention.

FIG. 13 illustrates the case with the same narrow column spacing as in FIG. 12, but with $V_{BLd}$ applied to the second column instead of 0V. The reverse bias across the P-N junction formed between the P+ region and N-well is now reduced and the drain depletion region does not extend as far into the N-well. Referring to FIG. 13, with the voltage, $V_{BLd}$, applied to the second column, the drain voltage of the parasitic field transistor is reduced so that Vds=$V_{BLd}$−Vpp. Since Vpp and $V_{BLd}$ are both positive voltages, this means that the magnitude of Vds is lower with $V_{BLd}$ on the second bit line than with 0V on that bit line. This allows the source and drain depletion regions to remain separated and no punch through occurs even with the narrower column spacing. All other factors being equal, this means that the columns can be placed closer to one another before punch through occurs with the bit line voltage, $V_{BLd}$, than if 0V were used. This allows the memory array to consume less silicon area than it would otherwise, improving the cost efficiency of the technology.

What is claimed is:

1. A method of operating a memory including first and second groups of memory cells, cells of the first group formed in a first semiconductor region and operatively coupled to a word line and respective bit lines, cells of the second group formed in a second semiconductor region and are operatively coupled to the word line and respective bit lines, the method comprising:

applying a first voltage to the word line;

applying a second voltage to the first semiconductor region;

applying selected voltages to the bit lines of the first group of cells;

applying a fourth voltage to the second semiconductor region;

applying a fifth voltage to the bit lines of the second group of cells;

wherein during a first time the first and fourth voltages are substantially the same, and the second and the selected voltages are substantially the same, and the fifth voltage is selected from the range of the first voltage to the second voltage, and wherein during a second time the second and fourth voltages are substantially the same and different from the first voltage, the fifth voltage is selected from the range of the first voltage to the second voltage, and the selected voltages being selected from the fifth and second voltages.

2. A method of operating a memory according to claim 1, wherein during the first time, the first voltage is greater than the second voltage.

3. A method of operating a memory according to claim 1, wherein during the second time, first voltage is less than the second voltage.

4. A method of operating a memory according to claim 1, wherein the first and second times occur during programming of the memory.

5. A method of erasing a first group of memory cells in a memory including at least first and second groups of cells, cells of the first group formed in a first semiconductor region are operatively coupled to a word line, cells of the second group formed in a second semiconductor region and are operatively coupled to the word line, the method comprising:

applying a first voltage to the word line;

applying a second voltage to the first semiconductor region;

applying selected voltages to the bit lines of the first group of cells;

applying a fourth voltage to the second semiconductor region;

applying a fifth voltage to the bit lines of the second group of cells;

wherein the second and fourth voltages are substantially the same and different from the first voltage, the fifth voltage is selected from the range of the first voltage to the second voltage, and the selected voltages being selected from the fifth and second voltages.

6. A method of erasing a first group of memory cells in a memory according to claim 5, wherein the first voltage is less than the second voltage.

7. A method of erasing a first group of memory cells in a memory according to claim 6, wherein the second voltage is positive.

8. A method of writing a first group of memory cells in a memory including at least first and second groups of cells, cells of the first group formed in a first semiconductor region and are operatively coupled to a word line, cells of the second group formed in a second semiconductor region and are operatively coupled to the word line, the method comprising:

applying a first voltage to the word line;

applying a second voltage to the first semiconductor region;

applying a third voltage to the bit lines of the first group of cells;

applying a fourth voltage to the second semiconductor region;

applying a fifth voltage to the bit lines of the second group of cells;

wherein the first and fourth voltages are substantially the same, and the second and third voltages are substantially the same, and the fifth voltage is selected from the range of the first voltage to the second voltage.

9. A method of writing a first group of memory cells in a memory according to claim 8, wherein the first voltage is greater than the second voltage.

10. A method of writing a first group of memory cells in a memory according to claim 9, wherein the first voltage is positive.

11. A method of erasing memory cells formed in a semiconductor region, a first group of the cells operatively coupled to a word line, a second group of the cells operatively coupled to the word line, the method comprising:

applying a first voltage to the word line;

applying a second voltage to the semiconductor region;

applying selected voltages to the bit lines of the first group of cells;

applying a fourth voltage to the bit lines of the second group of cells;

wherein the first and second voltages are different, the fourth voltage is selected from the range of the first voltage to the second voltage, and the selected voltages being selected from the second and fourth voltages.

12. A method of erasing a first group of memory cells in a memory according to claim 11, wherein the first voltage is less than the second voltage.

13. A method of erasing a first group of memory cells in a memory according to claim 12, wherein the second voltage is positive.

* * * * *